(12) United States Patent
Fischer et al.

(10) Patent No.: US 6,822,669 B2
(45) Date of Patent: Nov. 23, 2004

(54) METHOD AND MULTIBEAM SCANNING DEVICE FOR THE ABLATION OF FLEXO PRINTING PLATES BY LASER ENGRAVING

(75) Inventors: Jörg-Achim Fischer, Laboe (DE); Axel Gebhardt, Mönkeberg (DE); Thomas Jacobsen, Kiel (DE); Peter Ressel, Schönkirchen (DE); Dirk Steinke, Mielkendorf (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 131 days.

(21) Appl. No.: 10/068,727

(22) Filed: Feb. 6, 2002

(65) Prior Publication Data

US 2002/0117067 A1 Aug. 29, 2002

(30) Foreign Application Priority Data

Feb. 24, 2001 (DE) .......................................... 101 09 041

(51) Int. Cl.[7] .................................................. B41J 2/47
(52) U.S. Cl. ........................................ 347/239; 347/255
(58) Field of Search ................................ 347/239, 255, 347/238, 241, 256, 258, 244, 233, 237, 247; 372/6; 359/285, 298, 341.1; 385/7, 119; 219/121.6, 121.68, 121.75, 121.76, 121.79

(56) References Cited

U.S. PATENT DOCUMENTS

| | | | | |
|---|---|---|---|---|
| 4,295,145 A | * | 10/1981 | Latta | 347/255 |
| 4,577,926 A | * | 3/1986 | Dewey et al. | 385/119 |
| 4,995,693 A | * | 2/1991 | Wilson | 385/7 |
| 5,132,834 A | * | 7/1992 | Shinada | 359/285 |
| 5,745,153 A | * | 4/1998 | Kessler et al. | 347/241 |
| 5,748,222 A | * | 5/1998 | Roberts | 347/241 |
| 5,780,806 A | * | 7/1998 | Ferguson et al. | 219/121.68 |

FOREIGN PATENT DOCUMENTS

| | | |
|---|---|---|
| DE | 198 40 926 A1 | 5/2000 |
| DE | 100 24 456 A1 | 11/2001 |
| JP | 62 240 983 A | 10/1987 |
| JP | 62 284 326 A | 12/1987 |

* cited by examiner

*Primary Examiner*—Hai Pham
(74) *Attorney, Agent, or Firm*—Laurence A. Greenberg; Werner H. Stemer; Gregory L. Mayback

(57) ABSTRACT

A method and a multibeam scanning device for ablation of a surface on a rotating drum by laser engraving with a multi-spot array includes simultaneously emitting laser beams from fiber exits disposed beside one another, dividing up each of the beams, after emerging from the exit in an AOM array having a number of AOMs corresponding to the number of exits, into two or more partial beams modulated independently of one another, imaging the exits with an optical system on the surface, and moving the exits, the AOM array, and the optical system together in a drum axial direction while the surface is scanned by the multi-spot array in a drum circumferential direction to make possible, without increasing the number of fiber lasers, an increase in the number of scanning points of the multi-spot array and a reduction of the space required by the scanning device.

19 Claims, 4 Drawing Sheets

METHOD AND MULTIBEAM SCANNING DEVICE FOR THE ABLATION OF FLEXO PRINTING PLATES BY LASER ENGRAVING

BACKGROUND OF THE INVENTION

Field of the Invention

The invention relates to the field of electronic reproduction technology, especially to the production of film or printing plates and, in particular, flexo printing plates. The invention relates specifically to a method and a multibeam scanning device for the ablation of film or printing plates and, in particular, flexo printing plates by laser engraving with a multi-spot array, the plates being clamped onto the circumferential surface of a drum and scanned by a plurality of laser beams.

Flexo printing plates for direct laser image setting or laser engraving conventionally include a lower carrier layer made of polyester or another flexible polymer material, a central, so-called photopolymer layer containing unsaturated monomers and elastomeric binders that are crosslinked when exposed to UV light and, as a result, prevent being washed out later during development, and also an upper laser-sensitive layer that is partially removed in predefined areas, corresponding to the information to be transferred, by the laser engraving, in order, through the photopolymer layer, to produce a mask connected integrally to the printing plate. During the subsequent UV exposure of the printing plate, the mask covers those areas of the photopolymer layer at which the laser-sensitive layer has not previously been removed and, in these areas, prevents the crosslinking or curing of the photopolymer layer so that the photopolymer layer is washed out by the developer there during the subsequent development of the printing plate. The finally developed printing plate has elevated and depressed areas. The elevated areas are disposed where the laser-sensitive layer has previously been removed by the irradiation with the laser light.

In principle, however, in the future it is also conceivable to produce the elevated and depressed areas of the flexo printing plate, instead of by the partial removal of a mask and subsequent UV exposure and washing out the printing plate, by producing a printing plate from a laser-sensitive material that is removed selectively in one step by irradiation with laser light. In such a case, with the laser light used for the ablation, instead of a negative image of the information on the mask to be transferred, a positive image of the information is produced on the printing plate itself.

In the case of the flexo printing plates used at present, the laser engraving is carried out in a laser exposer, in which the printing plate is clamped onto the surface of a rotating drum and is scanned with one or more intensity-modulated laser beams to remove the laser-sensitive layer in the subsequent printing areas on the printing plate point by point in accordance with the predefined raster. As described, for example, in applicant's German Published, Non-Prosecuted Patent Application DE 100 24 456.4, the laser processing heads of the laser exposer, which can be moved in the axial direction of the drum, conventionally include a series of fiber lasers for the simultaneous production of a plurality of laser beams, an optical switch disposed in front of the fiber exit of each fiber laser to modulate the emergent laser beam by interrupting the laser radiation or permitting it to pass in accordance with the respective pixel data of image information to be transmitted, and an optical system for imaging the fiber exit as a multi-spot array on the material to be processed.

One possible way of increasing the processing speed of the laser exposer is to increase the number of scanning points of the multi-spot array. For such a purpose, however, a larger number of fiber lasers is needed, which is to be avoided, if possible, because of the relatively high costs of these components.

In a magazine article by B. M. Rosenheck, "180 megapixel per second optical image recording" in SPIE Vol, 299, Advances in Laser Scanning Technology (1981), an optical system for image recording is described, in which four laser beams previously separated by beam splitters and originating from a single laser are each deflected by an AOM, in which four different frequencies are applied to each AOM, to split the laser beams up into four partial beams, and in which the partial beams are subsequently deflected by a rotating polygon mirror onto the surface of a rotating drum to scan the drum surface substantially simultaneously at sixteen scanning points. However, such a system is not suitable for laser engraving because considerably higher laser powers are required. In addition, such a system has a relatively high space requirement, which makes it unsuitable for industrial use as a laser exposer.

SUMMARY OF THE INVENTION

It is accordingly an object of the invention to provide a method and multibeam scanning device for the ablation of flexo printing plates by laser engraving that overcomes the hereinafore-mentioned disadvantages of the heretofore-known devices and methods of this general type and that, without increasing the number of fiber lasers, permit an increase in the number of scanning points of the multi-spot array and that can be implemented with a low space requirement.

With the foregoing and other objects in view, there is provided, in accordance with the invention, a method for the ablation of a surface on a rotating drum having an axis including the steps of locating a number of laser fiber exits beside one another in an AOM array having a number of AOMs corresponding to the number of laser fiber exits, simultaneously emitting a plurality of laser beams from the laser fiber exits, dividing up each of the laser beams into at least two partial beams after the laser beams emerge from the laser fiber exits, modulating the partial beams independently of one another, imaging the laser fiber exits on the surface of the drum with an optical system, and laser engraving the surface with the multi-spot array by moving the laser fiber exits, the AOM array, and the optical system together in an axial direction of the drum while scanning the surface with the multi-spot array in a circumferential direction of the drum.

In accordance with another mode of the invention, the surface is a film or printing plates, in particular, flexo printing plates, and the laser fiber exits are YAG laser fiber exits.

In accordance with a further mode of the invention, the partial beams are in a plane perpendicular to the beam direction to produce a two-dimensional multi-spot array, which includes the points of incidence of the laser beams, preferably disposed one above another and beside one another in rows and columns, and, to achieve line connections by an appropriate time delay and deflection of the individual partial beams, for these to strike the rotating drum at the same time and for these points of incidence to lie beside one another on a straight line at equal intervals, the straight line being parallel to the direction of an axial relative movement between the drum and the laser processing head.

In accordance with an added mode of the invention, all of the partial beams are deflected in a direction of the drum such that points of incidence of the partial beams lie beside one another in a line on the surface and partly overlap adjacent points of incidence.

To divide the laser beams up into two or more partial beams, in accordance with an additional mode of the invention, a number of voltage signals with different frequencies are applied to each AOM, the number corresponding to the number of desired partial beams and their frequencies lying within a bandwidth of the AOM in which an adequate acousto-optic efficiency is ensured. The voltage signals are preferably applied to the AOM with a time offset so that the partial beams produced strike the flexo printing plate at the same time beside one another in the axial direction of the drum.

In accordance with yet another mode of the invention, the dividing step is carried out by applying voltage signals with at least two different frequencies to each AOM.

In accordance with yet a further mode of the invention, the applying voltage signals step is carried out by applying the voltage signals to the AOM with a time offset to cause the at least two partial beams to strike the surface in a line as a result of a rotation of the drum and to partly overlap the points of incidence of the partial beams.

To shorten the overall length of the multibeam scanning device, in accordance with yet an added mode of the invention, the YAG laser fiber exits are preferably aligned so as to converge in a fan shape, in each case some of the partial beams intersecting in the vicinity of an entry pupil of the optical system, which then aligns the partial beams substantially parallel and deflects them onto the flexo printing plate, ensuring substantially telecentric imaging of the fiber exit on the printing plate. The optical system preferably includes two lenses L1, L2 that form a beam expander, with which the beam diameter of the partial beam is widened in the ratio of the focal lengths f2/f1 of the two lenses L1, L2 and their angular spacing is reduced in the ratio of the focal lengths f1/f2, before they are focused on the printing plate by a lens L3 disposed behind the lenses L1 and L2.

In accordance with yet an additional mode of the invention, the optical system has an entry pupil, and the laser fiber exits are aligned to converge in a fan shape such that in each case some of the partial beams intersect in a vicinity of the entry pupil.

Because the spacing/diameter ratio of the points of incidence of the partial beams on the printing plate cannot be reduced arbitrarily, inter alia, because the mounting of the fiber exits in a holder makes certain minimum angular spacings necessary, and because the focal lengths of the optical system for shortening the overall lengths cannot be selected to be too great, in accordance with again another mode of the invention, the laser processing head is to be tilted about the optical axis of the optical system in relation to the drum to subsequently achieve line connection by an appropriate delay of the partial beams.

In accordance with again a further mode of the invention, the partial beams are aligned in a fan shape to cover at least two planes, the points of incidence of the partial beams on the surface in each plane respectively lying on an axis forming an angle $\alpha$ with the axial direction of the drum, where arctan $\alpha = lx/2ly$, lx being a center spacing of the points of incidence in a direction of the axes, and ly being a center spacing of the points of incidence in a direction perpendicular to the axes.

In accordance with again an added mode of the invention, the laser fiber exits are substantially telecentrically imaged on the surface with the optical system.

In accordance with again an additional mode of the invention, the partial beams are substantially aligned in parallel downstream of an exit pupil of the optical system with respect to a travel direction of the partial beams and the partial beams are deflected onto the surface.

In accordance with still another mode of the invention, the partial beams have an angular spacing and each have a diameter, and the diameter of the partial beams is widened and the angular spacing of the partial beams is reduced in the optical system.

With the objects of the invention in view, there is also provided a multibeam scanning device for the ablation of a surface on a drum by laser engraving with a multi-spot array, the drum being rotatable about an axis of rotation, the device including a number of laser fiber exits disposed beside one another, an AOM array having a number of AOMs corresponding to the number of the laser fiber exits, the AOM array connected to the laser fiber exits, the AOMs receiving laser beams emerging from the laser fiber exits, the AOM array dividing up each of the laser beams into at least two partial beams each modulated independently of one another, an optical system for imaging the laser fiber exits at the surface on the drum, the optical system disposed downstream of the AOM array with respect to a travel direction of the laser beams, and the laser fiber exits, the AOM array, and the optical system forming a multi-spot array and being moveable together in a direction of the axis of rotation of the drum while the surface is scanned by the AOM array in a circumferential direction of the drum.

In accordance with still a further feature of the invention, there are provided voltage signal devices connected to the AOMs and applying voltage signals having at least two different frequencies to each of the AOMs to divide up the laser beams into the at least two partial beams.

In accordance with still an added feature of the invention, the AOM array is disposed between the laser fiber exits and the entry pupil.

In accordance with still an additional feature of the invention, the AOMs have converters and an alignment of the converters corresponds to an alignment of convergent ones of the laser beams.

In accordance with a concomitant feature of the invention, the optical system has a beam expander widening the diameter of the partial beams while reducing the angular spacing of the partial beams.

Other features that are considered as characteristic for the invention are set forth in the appended claims.

Although the invention is illustrated and described herein as embodied in a method and multibeam scanning device for the ablation of flexo printing plates by laser engraving, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
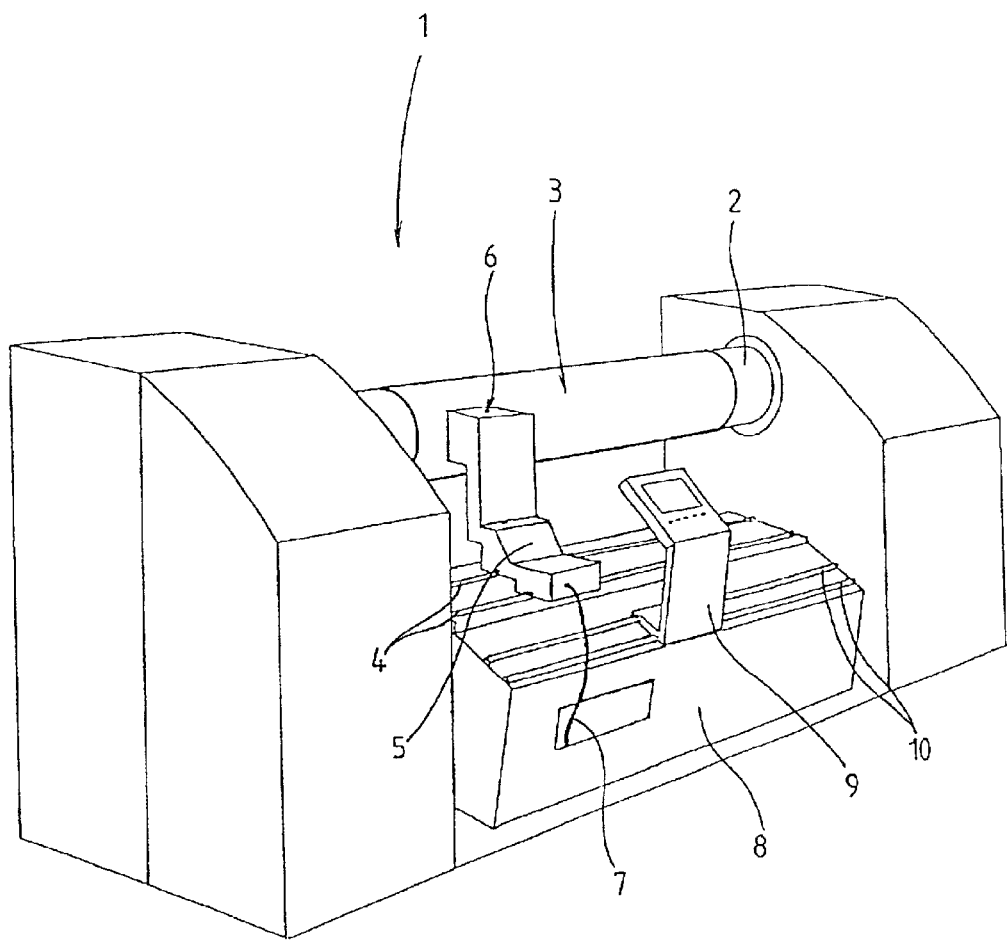
FIG. 1 is a perspective view of a device for the ablation of flexo printing plates on a rotating drum by laser engraving with a multi-spot array according to the invention.

Referring now to the figures of the drawings in detail and first, particularly to FIG. 1 thereof, there is shown a device (1) for laser engraving for flexo printing plates substantially including a drum (2) that is rotatably clamped between two lateral holders and on whose circumferential surface the flexo printing plates (3) to be processed are clamped. Further included is a non-illustrated rotary drive for rotating the drum (2), a printing plate (3) clamped thereon, a carriage (5) that can be moved on guides (4) in the axial direction of the drum (2) and of the printing plate (3), a laser processing head (6) that is rotatably mounted on the carriage (5) and that is connected by a bundle of eight fiber optic conductors (7) to a not-visible multibeam YAG laser in a stationary underpart (8) of the device (1), and a control desk (9) that can likewise be moved on guides (10) in the axial direction along the drum (2). The multibeam YAG laser produces eight laser beams that, after passing through one of the fiber optic conductors (7), are focused individually before the laser beams (14) produced in each case are each divided into two partial beams (14a, 14b), so that the printing plate (3) is simultaneously scanned with the sixteen partial beams (14a, 14b).

Figure 2:
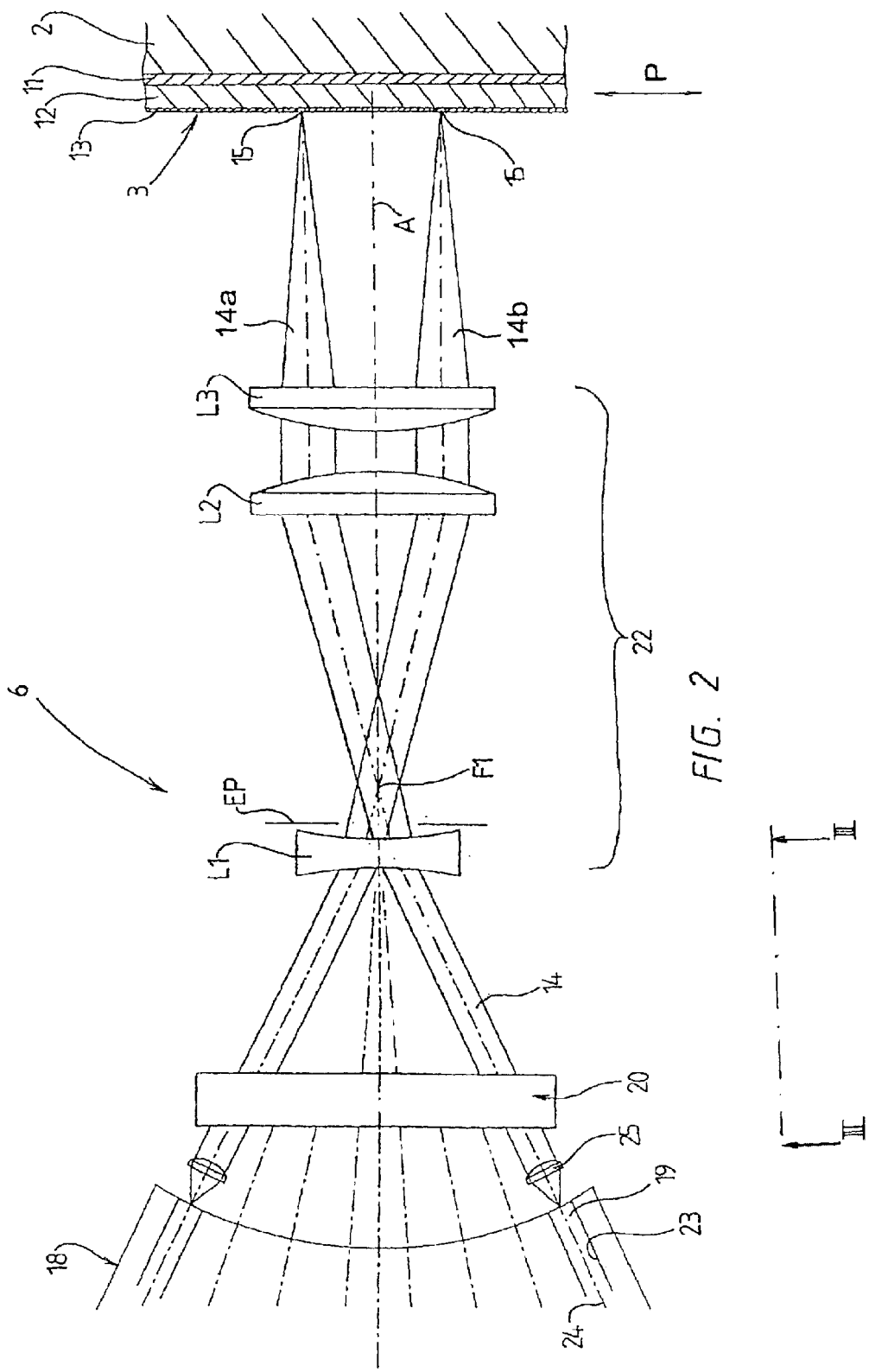
FIG. 2 is a schematic and block diagram of the beam path of a plurality of laser beams between their emergence from fiber lasers of a multibeam laser processing head belonging to the device of FIG. 1 and a flexo printing plate.

As best illustrated in FIG. 2, the commercially available flexo printing plate (3) clamped onto the drum (2) for laser engraving substantially conventional includes a lower carrier layer (11) made of metal or polymer, preferably, a polyester film, a photopolymer layer (12) applied to the top of the carrier layer (11) and containing unsaturated monomers and elastomeric binders that are crosslinked to form long-chain polymers when exposed to UVA light, and a laser-sensitive layer (13) that is opaque to UV radiation and is applied to the top of the photopolymer layer (12).

During the laser engraving, the flexo printing plate (3) is scanned in accordance with a predefined dot pattern with the partial beams (14a, 14b) focused onto the laser-sensitive layer (13), as illustrated schematically in FIG. 2 by two of the partial beams (14a). In the process, the laser-sensitive layer (13) is removed by ablation at the points of incidence (15) of the partial beams (14a, 14b) that are intended to transfer printing ink during the subsequent printing operation. The laser-sensitive layer is maintained in the remaining areas. The ablation is a thermal process, in which the laser-sensitive layer (13) evaporates down as far as the photopolymer layer (12), forming dot-like openings, and is removed as a result. During subsequent exposure with UV light, the photopolymer layer (12) cures under the openings and, as opposed to the remaining areas, is not washed out during the subsequent development. The wavelengths of the laser radiation emitted by the YAG lasers lies in the infrared range, while the photopolymer is sensitive in the UV range, so that it is not influenced by the laser light during the scanning with the partial beams (14a, 14b). The scanning of the flexo printing plate (3) is carried out in a predefined dot pattern that is produced in the form of digital pixel data by a non-illustrated raster image processor from the text or image information to be transferred to the printing plate (3).

The sixteen-channel laser processing head (6) that can be moved in a feed direction (P) parallel to the axis of rotation of the drum (2), along the printing plate (3), substantially includes a holder (18) for fiber exits (19) from the eight fiber optic conductors (7), a linear AOM array (20) including eight AOMs (21), in which the eight laser beams (14) are respectively divided into the two partial beams (14a, 14b) after emerging from the fiber exit (19), and the partial beams are subjected, independently of one another, to intensity modulation, and also to an f-θ optical system (22), with which the fiber exits (19) are imaged telecentrically as a multi-spot array on the surface of the printing plate (3).

The fiber exits (19) are inserted into receptacles (23) belonging to the holder (18). The receptacles are formed by holes or V-shaped grooves and are disposed radially along a circular arc, so that adjacent receptacles (23) have an angular spacing of about 10 mrad. The spacing between the holder (18) and the optical system (22) is selected such that the optical axes (24) of the fan-like partial beams (14a, 14b), lying in two planes, intersect in the vicinity of an entry pupil (EP) of the optical system (22) (cf. FIGS. 2 and 4).

Figure 5:
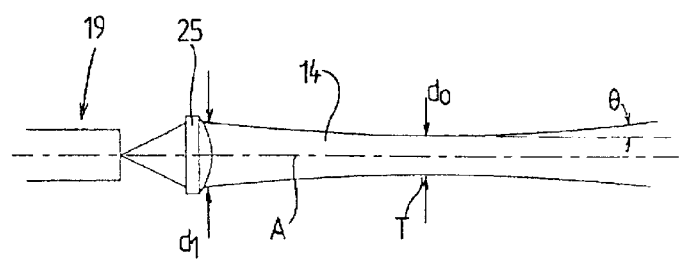
FIG. 5 is an enlarged view of the beam path according to the invention in the vicinity of a fiber exit of a fiber laser of the laser processing head of FIG. 1.

As best illustrated in FIGS. 2 and 5, the fiber exits (19) are each provided with a micro lens (25) that focuses the laser beams emerging from the fiber exit (19). The focal length f of the micro lens (25) is between f=3 mm and f=7 mm, depending on the numerical aperture of the fiber optic conductor. As FIG. 5 illustrates, the beam diameter of the laser beam emerging from the micro lens (25) decreases from a diameter d1 of about 850 μm immediately after the micro lens (25) to a waist diameter d0 of about 700 μm at $1/e^2$ and, after that, increases again, with a divergence angle $\theta = 2\lambda/\pi d_0$, from about 1 mrad at a beam diameter of $d_0 = 700$ μm, as illustrated by the curved marginal beams.

The AOM array (20) and the entry pupil (EP) of the optical system (22) are each located at such a distance from the waist (T) of the laser beams (14) that both the AOMs (21) and the entry pupil (EP) lie within the Rayleigh distance, within which the diameter of the laser beams (14) increases to $d_0 \times \sqrt{2}$.

Figure 3:
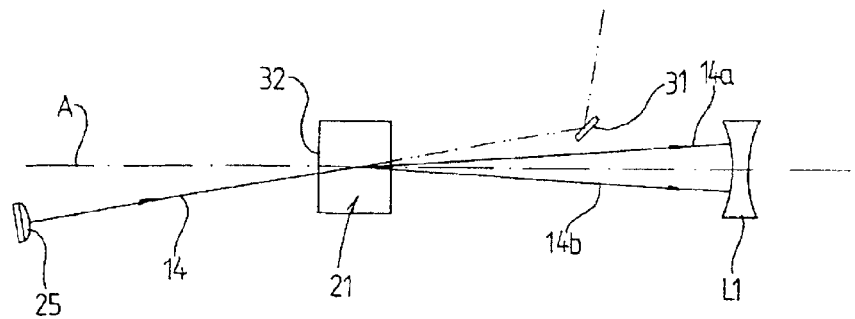
FIG. 3 is a schematic and block diagram of part of a beam path in the area of an AOM array laser processing head from FIG. 2, when viewed in the direction of the arrows III—III in FIG. 2.
Figure 4:
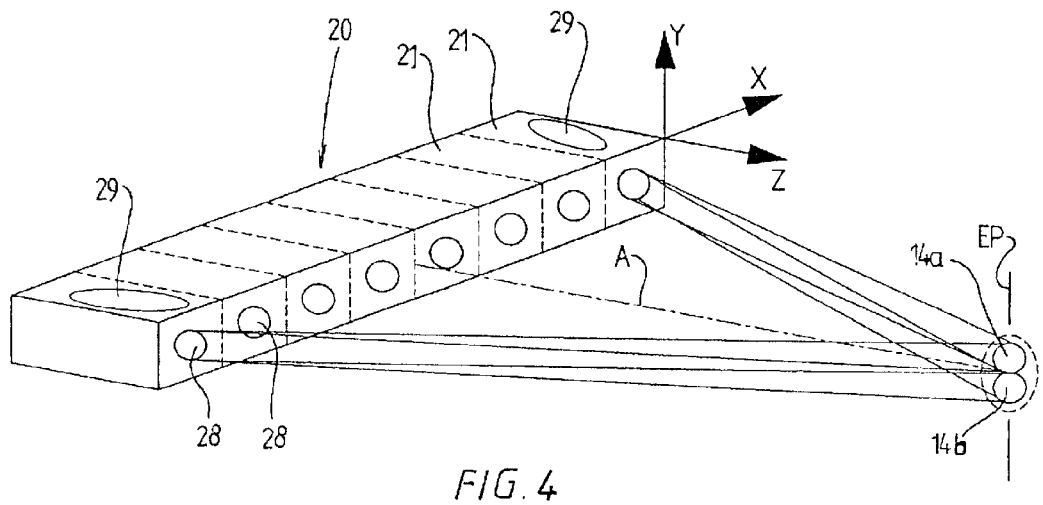
FIG. 4 is a perspective view of a linear AOM array used for modulating and dividing the laser beams up into a plurality of partial beams according to the invention.

As best illustrated in FIG. 4, the AOM array (20) disposed in the area of the laser beam fan in each case has one AOM (21) for each of the eight incoming laser beams (14). The AOMs (21) correspond in their construction to conventional acousto-optical modulators and include a crystal (28) that is transparent to the laser beams (14) and a piezoelectric converter (29) (illustrated only in some of the AOMs) that outputs ultrasound waves into the crystal (28) when a voltage signal is applied to the converter (29). As it passes through the crystal (28), the laser beam (14) is diffracted at the ultrasound waves produced by the converter (29), either, depending on the respective amplitude of the voltage signal, being deflected as a light beam of first order toward the entry pupil (EP) of the optical system (22) and from there to the flexo printing plate (3) or being masked out by a mirror (31) (FIG. 3) as a light beam of the zeroth order, depending on whether the laser-sensitive layer (13) of the printing plate (3) is to be removed at the appropriate point or not. The amplitude of the voltage signals is controlled on the basis of the pixel data.

The AOM array (20) is located at a point in the beam path of the laser beams (14) at which the intervals of the individual AOMs (21) correspond to the intervals between the associated laser beams (14), and is aligned such that the laser beams (14) in each case enter an optical entry surface (32) of the AOMs (21) approximately at the Bragg angle (FIG. 3). To improve the refractive efficiency of the AOMs (21), and to lead the laser beams (14) through the AOMs (21) as far as possible without vignetting, the converters (29) on the individual AOMs (21) are in each case aligned in parallel with the optical axis (24) of the laser beam (14) passing through (FIG. 4). Furthermore, the AOM array (20) and the entry pupil (EP) of the optical system (22) is in each case located at such a distance from the waist (T) of the laser beams (14) (FIG. 5) that both the AOMs (21) and the entry pupil (EP) lie within the Rayleigh distance, within which the diameter of the laser beams (14) increases to $d_0 \times \sqrt{2}$.

As already mentioned, according to the invention, in addition to intensity modulation and the selective changeover between the zeroth and first order in each AOM (21) of the AOM array (20), the incoming laser beam (14) is divided up into two or more partial beams (14a, 14b) by light of the first order being permitted to emerge from the AOM (21) at diffraction angles of various magnitudes, as illustrated schematically in FIGS. 3 and 4 using the example of two partial beams (14a, 14b). The two different diffraction angles in a direction perpendicular to the plane of the drawing of FIG. 2 are obtained by two voltage signals with different frequencies being applied to each AOM (21), the angular spacing between the two partial beams (14a, 14b) produced increasing with the frequency interval between the two frequencies applied. The number of possible frequencies depends on the bandwidth of the AOMs (21) used and on the frequency interval of the frequencies applied.

The optical system (22) illustrated in FIG. 2 substantially includes a biconcave lens (L1) with a focal length $f_1$, disposed in front of the entry pupil (EP) and in its vicinity in the beam path, and two plano-convex lenses (L2) and (L3) with the focal lengths $f_2$ and $f_3$, whose convex sides are opposite each other. The lenses (L1) and (L2) form a "beam expander" that widens the diameter of the partial beams (14a, 14b) in the ratio of the focal lengths $f_2/f_1$ and, at the same time, reduces their angular spacing in the ratio of the focal lengths $f_1/f_2$. With the lens (L3), the sixteen partial beams (14a, 14b) are focused telecentrically, at the distance $f_3$, on the laser-sensitive layer (13) of the printing plate (3).

Figure 6:
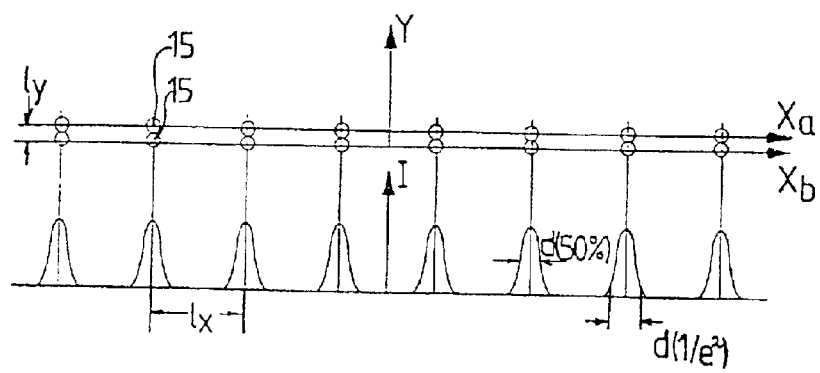
FIG. 6 is a two-dimensional diagram of a multi-spot array of the points of incidence of the laser beams on the flexo printing plate, without any relative movement between laser processing head and flexo printing plate, and also the light intensity distribution at the points of incidence according to the invention.

The focal lengths of the lenses (L1), (L2), and (L3) are, for example, selected such that, with an angular spacing of the fiber exits (19) of 10 mrad and a spacing/diameter ratio of the fiber exits (19) of 8 to 1, for the two-dimensional multi-spot array illustrated in FIG. 6 and including 2×8 points of incidence (15), which is produced on the laser-sensitive layer (13) without any relative movement between laser processing head (6) and the printing plate (3), the result is spot diameters $d(1/e^2)$ of about 32 μm and d(50%) of about 20 μm and, between adjacent points of incidence (15) of the multi-spot array in the planes covered by the partial beams (14a or 14b), that is to say, in the direction of the axes (Xa, Xb), center spacings (lx) of about 160 μm. In a direction (Y axis) perpendicular to the axes (Xa, Xb), the adjacent points of incidence (15) of the partial beams (14a, 14b) preferably have center spacings (ly) of about 20 μm so that they overlap at approximately 50% of the maximum intensity. As a result, the frequency interval between the two frequencies applied to each AOM (21) can be kept as low as possible, so that the frequencies come to lie approximately centrally within the bandwidth of the AOM (21), and the highest possible acousto-optical efficiency is ensured.

Figure 7:
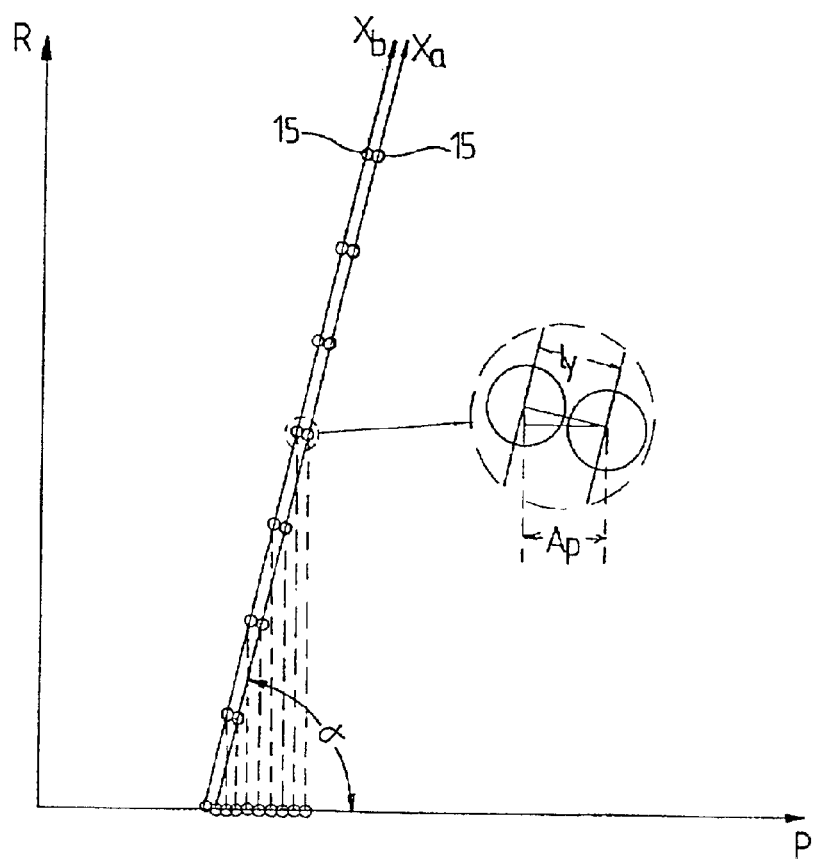
FIG. 7 is a graph illustrating a different view of FIG. 6 following tilting of the laser processing head to achieve line connection and without the line intensity distributions from FIG. 6.

To achieve line connection, that is to say, in order likewise to reduce the center spacings (lx) between two adjacent points of incidence (15) in the axial direction (P) of the drum (2) to such an extent that the two points (15) overlap at 50% of the maximum intensity, the entire laser processing head (6) is tilted about the axis (A) out of the position illustrated in FIG. 2, so that the axes (Xa, Xb) form with the feed direction (P) an angle α=arctan lx/2d(50%)=arctan 8/2= 75.96°, as illustrated in FIG. 7.

To ensure equal spacings (Ap) between adjacent points of incidence (15) in the feed direction (P), it is necessary to take a correction factor into account with regard to the frequency spacing between the two frequencies applied to each AOM (21). In accordance with the enlarged detail view from FIG. 7, Ap=ly/sin α, so that at an angle α of 75.96°, the frequency spacing has to be enlarged by about 3% with respect to the calculated value ly, at which the adjacent points of incidence (15) overlap at 50% of the maximum intensity.

To ensure that all 16 points of incidence (15) of the multi-spot array lie on a straight line parallel to the feed direction (P) and do not strike the laser-sensitive layer (13) on the surface of the flexo printing plate (3) with an offset in the circumferential direction (R) of the drum (2), the voltage signals are applied with a time delay, depending on the rotational speed of the drum (2), with respect to an adjacent AOM (21) in the AOM array (20). In such a case, the delay between the points of incidence of two adjacent points of incidence (15) on the axis (Xa or Xb) is selected such that the surface of the flexo printing plate (3) moves through the distance lx/sin α in the drum circumferential direction (R) during this time. Secondly, the two voltage signals that serve to divide up the incoming laser beam (14) into the two emergent partial beams (14a, 14b) are also applied to each individual AOM (21) with a time delay. Here, the delay is selected such that during this time the surface of the flexo printing plate (3) moves through the distance ly/cos α in the drum circumferential direction (R).

We claim:

1. A method for the ablation of a surface on a rotating drum having an axis, which comprises:

locating a number of laser fiber exits beside one another in an AOM array having a number of AOMs corresponding to the number of laser fiber exits;

simultaneously emitting a plurality of laser beams from the laser fiber exits;

dividing up each of the laser beams into at least two partial beams after the laser beams emerge from the laser fiber exits;

modulating the partial beams independently of one another;

imaging the modulated partial laser beams on the surface of the drum with an optical system having an entry pupil;

aligning the laser fiber exits to converge in a fan shape for intersecting some of the partial beams in a vicinity of the entry pupil;

aligning the partial beams in a fan shape to cover at least two planes, points of incidence of the partial beams on the surface in each plane respectively lying on an axis forming an angle α with the axial direction of the drum, where arctan α=lx/2ly.

lx being a center spacing of the points of incidence in a direction of the axes; and ly being a center spacing of the points of incidence in a direction perpendicular to the axes; and laser engraving the surface with the multi-spot array by moving the laser fiber exits, the AOM array, and the optical system together in an axial direction of the drum while scanning the surface with the multi-spot array in a circumferential direction of the drum.

2. The method according to claim 1, wherein the surface is a film.

3. The method according to claim 1, wherein the surface is a printing plate.

4. The method according to claim 3, wherein the printing plate is a flexo printing plate.

5. The method according to claim 1, wherein the laser fiber exits are YAG laser fiber exits.

6. The method according to claim 1, which further comprises deflecting all of the partial beams in a direction of the drum such that points of incidence of the partial beams lie beside one another in a line on the surface and partly overlap adjacent points of incidence.

7. The method according to claim 1, which further comprises carrying out the dividing step by applying voltage signals with at least two different frequencies to each AOM.

8. The method according to claim 7, which further comprises carrying out the applying voltage signals step by applying the voltage signals to the AOM with a time offset to cause the at least two partial beams to strike the surface in a line as a result of a rotation of the drum and to partly overlap the points of incidence of the partial beams.

9. The method according to claim 1, which furthe comprises substantially telecentrically imaging the laser fiber exits on the surface with the optical system.

10. The method according to claim 9, which further comprises substantially aligning the partial beams in parallel downstream of the optical system with respect to a travel direction of the partial beams and deflecting the partial beams onto the surface.

11. The method according to claim 1, wherein the partial beams have an angular spacing and each have a diameter, and which further comprises widening the diameter of the partial beams and reducing the angular spacing of the partial beams in the optical system.

12. A multibeam scanning device for the ablation of a surface on a drum by laser engraving with a multi-spot array, the drum being rotatable about an axis of rotation, the device comprising;

a number of laser fiber exits disposed beside one another;

an AOM array having a number of AOMs corresponding to said number of said laser fiber exits, said AOM array connected to said laser fiber exits, said AOMs receiving laser beams emerging from said laser fiber exits, said AOM array dividing up each of the laser beams into at least two partial beams each modulated independently of one another and having points of incidence;

an optical system for imaging said laser fiber exits at the surface on the drum, said optical system having an entry pupil and being disposed downstream of said AOM array with respect to a travel direction of the laser beams;

said laser fiber exits aligned to converge in a fan shape for having some of the partial beams intersect in a vicinity of said entry pupil;

said laser fiber exits, said AOM array, and said optical system forming a multi-spot array and being moveable together in a direction of the axis of rotation of the drum while the surface is scanned by said AOM array in a circumferential direction of the drum;

the point of incidence of all of the partial beams lying beside one another in a line on the surface and partly overlapping adjacent points of incidence;

the partial beams covering at least two planes; and the points of incidence on the surface in each plane respectively lying on an axis forming an angle α with the axis of rotation of the drum, where arctan α=lx/2ly:

lx being a center spacing of the points of incidence in a direction of the axes; and ly being a center spacing of the points of incidence in a direction perpendicular to the axes.

13. The multibeam scanning device according to claim 12, including voltage signal devices connected to said AOMs and applying voltage signals having at least two different frequencies to each of said AOMs to divide up the laser beams into the at least two partial beams.

14. The multi-beam scanning device according to claim 12, wherein the partial beams downstream of said optical system with respect to a travel direction of the partial beams are aligned substantially parallel to one another.

15. The multibeam scanning device according to claim 12, wherein said AOM array is disposed between said laser fiber exits and said entry pupil.

16. The multibeam scanning device according to claim 12, wherein said optical system images said laser fiber exits substantially telecentrically on the surface.

17. The multibeam scanning device according to claims 12, wherein:

the partial beams have an angular spacing and each have a diameter; and said optical system has a beam expander widening the diameter of the partial beams while reducing the angular spacing of the partial beams.

18. The multibeam scanning device according to claim 12, wherein said laser fiber exits are YAG laser fiber exits.

19. A multibeam scanning device for the ablation of a surface on a drum by laser engraving with a multi-spot array, the drum being rotatable about an axis of rotation, the device comprising:

a number of laser fiber exits disposed beside one another;

an AOM array having a number of AOMs corresponding to said number of said laser fiber exits, said AOM array connected to said laser fiber exits, said AOMs receiving laser beams emerging from said laser fiber exits, said AOMs having converters and an alignment of said converters corresponding to an alignment of convergent ones of the laser beams, said AOM array dividing up each of the laser beams into at least two partial beams each modulated independently of one another;

an optical system for imaging said laser fiber exits at the surface on the drum, said optical system having an entry pupil and being disposed downstream of said AOM array with respect to a travel direction of the laser beams;

said laser fiber exits aligned to converge in a fan shape for having some of the partial beams intersect in a vicinity of said entry pupil; and said laser fiber exits, said AOM array, and said optical system forming a multi-spot array and being moveable together in a direction of the axis of rotation of the drum while the surface is scanned by said AOM array in a circumfrential direction of the drum.

* * * * *